(12) United States Patent
Li et al.

(10) Patent No.: US 12,712,512 B2
(45) Date of Patent: Aug. 18, 2026

(54) LOW-VOLTAGE HIGH-SPEED PROGRAMMABLE EQUALIZATION CIRCUIT

(71) Applicant: XIAMEN UX IC CO., LTD., Xiamen (CN)

(72) Inventors: Faming Li, Xiamen (CN); Yonghui Lin, Xiamen (CN); Ming Hong, Xiamen (CN)

(73) Assignee: XIAMEN UX IC CO., LTD., Xiamen (CN)

( * ) Notice: Subject to any disclaimer, the term of this patent is extended or adjusted under 35 U.S.C. 154(b) by 538 days.

(21) Appl. No.: 18/360,792

(22) Filed: Jul. 27, 2023

(65) Prior Publication Data

US 2023/0370038 A1 Nov. 16, 2023

Related U.S. Application Data

(63) Continuation-in-part of application No. 16/969,987, filed on Aug. 14, 2020, now abandoned.

(51) Int. Cl.
*H03F 3/45* (2006.01)
*H03G 5/16* (2006.01)

(52) U.S. Cl.
CPC ......... *H03G 5/165* (2013.01); *H03F 3/45076* (2013.01); *H03G 2201/103* (2013.01)

(58) Field of Classification Search
CPC .................................. H03F 3/45; H03F 3/191
USPC .................................. 330/252, 261, 69, 302
See application file for complete search history.

*Primary Examiner* — Henry Choe
(74) *Attorney, Agent, or Firm* — Birchwood IP

(57) ABSTRACT

A low-voltage high-speed programmable equalization circuit includes a gain boosting amplifier stage, a CML differential amplifier stage, and an emitter follower. An input terminal of the gain boosting amplifier stage serves as an input terminal of the equalization circuit. An output terminal of the gain boosting amplifier stage is connected to an input terminal of the CML differential amplifier stage. An output terminal of the CML differential amplifier stage is connected to an input terminal of the emitter follower. An output terminal of the emitter follower serves as an output terminal of the equalization circuit.

4 Claims, 5 Drawing Sheets

LOW-VOLTAGE HIGH-SPEED PROGRAMMABLE EQUALIZATION CIRCUIT

CROSS REFERENCE TO RELATED APPLICATIONS

This is a continuation-in-part application of co-pending U.S. patent application Ser. No. 16/969,987, "LOW-VOLTAGE HIGH-SPEED PROGRAMMABLE EQUALIZATION CIRCUIT", filed on Aug. 14, 2020.

BACKGROUND OF THE INVENTION

1. Field of the Invention

The present invention relates to an electronic circuit, and more particularly to a low-voltage high-speed programmable equalization circuit.

2. Description of the Prior Art

Compared with digital signals, high-speed signal technology has many problems. A key problem is that there are frequency-dependent transmission losses in all transmission media. It is mainly caused by skin effect and dielectric loss. The higher the frequency, the more obvious the skin effect and the dielectric loss, and the greater the transmission loss. Due to the transmission loss, the attenuation of the high frequency component of the signal is greater than that of the low frequency component, so the ISI (intersymbol interference) of signals received by the receiver is severe. As a result, it is difficult to recover clock data and leads to high BER (bit error rate), limiting the data transmission frequency and the transmission distance greatly.

An equalization circuit is configured to solve the problem of attenuation caused by the transmission loss of transmission lines in high-speed data transmission. Its main function is to offset or reduce the influence of the non-linearity of the cable on the bit error rate of data transmission. It can reduce the intersymbol interference of the data transmission and reduce the bit error rate greatly. Due to its important role in high-speed data transmission, the equalization circuit has become a key part of the high-speed data transmission transceiver.

As shown in FIG. 1, in the prior art, an equalization circuit is implemented by a high-speed differential amplifier with source negative feedback. The feedback consists of a fixed resistor and a fixed capacitor. The resistor is equivalent to an all-pass path, and the capacitor is equivalent to a high-pass path. The differential amplifier with source negative feedback composed of the resistor and the capacitor is equivalent to a split-path amplifier, equivalent to a high-pass filter.

However, the existing equalization circuit has the following problems. The resistor and the capacitor of the negative feedback of the equalization circuit are fixed. Once the design of the equalization circuit is completed, since the capacitance value and the resistance value are fixed, the zero and the pole of the transmission function are also fixed, and the high-frequency gain and the low-frequency gain are fixed. In this case, if the length of the cable changes, the high-frequency attenuation of the signal changes. This equalization circuit cannot be arbitrarily adjusted to compensate for the attenuation caused by cables of different lengths. If the compensation is insufficient, the signal cannot be recovered well, affecting the signal quality. If the compensation is excessive, the signal will be distorted and the signal quality will be affected.

SUMMARY OF THE INVENTION

The primary object of the present invention is to provide a low-voltage high-speed programmable equalization circuit. By setting a programmable equalization compensation factor, a suitable equalization compensation factor can be selected to achieve the purpose of adaptive adjustment.

In order to achieve the above object, the technical solutions adopted by the present invention are described below.

An equalization circuit comprises a gain boosting amplifier stage, a CML differential amplifier stage, and an emitter follower. An input terminal of the gain boosting amplifier stage serves as an input terminal of the equalization circuit. An output terminal of the gain boosting amplifier stage is connected to an input terminal of the CML differential amplifier stage. An output terminal of the CML differential amplifier stage is connected to an input terminal of the emitter follower. An output terminal of the emitter follower serves as an output terminal of the equalization circuit.

The gain boosting amplifier stage includes an input common-mode voltage bias unit, an input impedance matching unit, a pure resistor network path unit, a resistor-capacitor network high-pass path unit, a first differential amplifier circuit, and a second differential amplifier circuit. The input common-mode voltage bias unit is configured to set a bias voltage of the gain boosting amplifier stage. The input impedance matching unit is configured to match an input impedance of the gain boosting amplifier stage with an impedance of an input module board connected to a chip. The input terminal of the gain boosting amplifier stage is connected to the pure resistor network path unit. The pure resistor network path unit is connected to the first differential amplifier circuit. The first differential amplifier circuit is connected to the output terminal of the gain boosting amplifier stage. The input terminal of the gain boosting amplifier stage is connected to the resistor-capacitor network high-pass path unit. The resistor-capacitor network high-pass path unit is connected to the second differential amplifier circuit. The second differential amplifier circuit is connected to the output terminal of the gain boosting amplifier stage.

Each of the first differential amplifier circuit and the second differential amplifier circuit is provided with a variable current source. A total current of the two variable current sources is kept constant.

The input common-mode voltage bias unit includes a resistor R5 and a resistor R6. The resistor R5 and the resistor R6 are connected in series. One end of the resistor R5 is connected to a constant voltage power supply VDD. One end of the resistor R6 is grounded.

The input impedance matching unit includes a resistor R3 and a resistor R4. One end of the resistor R3 is connected between the resistor R5 and the resistor R6. Another end of the resistor R3 is connected to the input terminal INP of the gain boosting amplifier stage. One end of the resistor R4 is connected between the resistor R5 and the resistor R6. Another end of the resistor R4 is connected to the input terminal INN of the gain boosting amplifier stage.

The pure resistor network path unit includes a resistor R7, a resistor R8, and a resistor R9. One end of the resistor R7 is connected to the input terminal INP of the gain boosting amplifier stage. Another end of the resistor R7 is connected to one end of the resistor R9. One end of the resistor R8 is connected to the input terminal INN of the gain boosting amplifier stage. Another end of the resistor R8 is connected to another end of the resistor R9.

The first differential amplifier circuit includes a transistor Q2, a transistor Q3, a resistor R13, a resistor R14, and a variable current source I2. A base of the transistor Q2 is connected between the resistor R7 and the resistor R8. An emitter of the transistor Q2 is grounded through the variable current source I2. A collector of the transistor Q2 is connected to the power supply VDD via the resistor R13, and the collector of the transistor Q2 is further connected to the output terminal OUTN0 of the gain boosting amplifier stage. A base of the transistor Q3 is connected between the resistor R8 and the resistor R9. An emitter of the transistor Q3 is grounded through the variable current source I2. A collector of the transistor Q3 is connected to the power supply VDD through the resistor R14, and the collector of the transistor Q3 is further connected to the output terminal OUTP0 of the gain boosting amplifier stage.

The resistor-capacitor network high-pass path unit includes a resistor R10, a resistor R11, a resistor R12, a capacitor C1, and a capacitor C2. The resistor R10 and the capacitor C1 are connected in parallel, one end of which is connected to the input terminal INP of the gain boosting amplifier stage, and another end of which is connected to one end of the resistor R12. The resistor R11 and the capacitor C2 are connected in parallel, one end of which is connected to the input terminal INN of the gain boosting amplifier stage, and another end of which is connected to another end of the resistor R12.

The second differential amplifier circuit includes a transistor Q4, a transistor Q5, a resistor R13, a resistor R14, and a variable current source I3. A base of the transistor Q4 is connected to the end, connected to the resistor R10 and the capacitor C1, of the resistor R12. An emitter of the transistor Q4 is grounded through the variable current source I3. A collector of the transistor Q4 is connected to the power supply VDD via the resistor R13, and the collector of the transistor Q4 is further connected to the output terminal OUTN0 of the gain boosting amplifier stage. A base of the transistor Q5 is connected to the end, connected to the resistor R11 and the capacitor C2, of the resistor R12. An emitter of the transistor Q5 is grounded through the variable current source I3. A collector of the transistor Q5 is connected to the power supply VDD via the resistor R14, and the collector of the transistor Q5 is further connected to the output terminal OUTP0 of the gain boosting amplifier stage.

The CML differential amplifier stage includes a transistor Q6, a transistor Q7, a resistor R15, a resistor R16, and a current source I4. A base of the transistor Q6 is connected to the input terminal INP1 of the CML differential amplifier stage. The input terminal INP1 of the CML differential amplifier stage is connected to the output terminal OUTP0 of the gain boosting amplifier stage. An emitter of the transistor Q6 is grounded via the current source I4. A collector of the transistor Q6 is connected to the power supply VDD via the resistor R15, and the collector of the transistor Q6 is further connected to the output terminal OUTN1 of the CML differential amplifier stage. A base of the transistor Q7 is connected to the input terminal INN1 of the CML differential amplifier stage. The input terminal INN1 of the CML differential amplifier stage is connected to the output terminal OUTP0 of the gain boosting amplifier stage. An emitter of the transistor Q7 is grounded via the current source I4. A collector of the transistor Q7 is connected to the power supply VDD via the resistor R16, and the collector of the transistor Q7 is further connected to the output terminal OUTP1 of the CML differential amplifier stage.

The emitter follower includes a transistor Q8, a transistor Q9, a current source I5, and a current source I6. A base of the transistor Q8 is connected to the input terminal INP2 of the emitter follower. The input terminal INP2 of the emitter follower is connected to the output terminal OUTP1 of the CML differential amplifier stage. A collector of the transistor Q8 is connected to the power supply VDD. An emitter of the transistor Q8 is grounded via the current source I5, and the emitter of the transistor Q8 is further connected to the output OUTP of the emitter follower. A base of the transistor Q9 is connected to the input terminal INN2 of the emitter follower. The input terminal INN2 of the emitter follower is connected to the output terminal OUTN1 of the CML differential amplifier stage. A collector of the transistor Q9 is connected to the power supply VDD. An emitter of the transistor Q9 is grounded via the current source I6, and the emitter of the transistor Q9 is further connected to the output OUTN of the emitter follower.

After adopting the above solutions, through the gain boosting amplifier stage of the present invention, the input signal passes through one path, the pure resistor network all-pass path, and another path, the resistor-capacitor network high-pass path, thereby achieving high-pass filtering and minimizing effective high-speed signal loss. The two variable current sources of the first differential amplifier circuit and the second differential amplifier circuit in the gain boosting amplifier stage are programmable to achieve equalization compensation. According to different cable lengths in different application scenarios, the ratio of the two variable current sources can be adjusted to achieve suitable equalization compensation to meet the needs of a variety of applications; and will not affect the carrying capacity of high-speed signals.

The present invention uses the CML differential amplifier stage after the gain boosting amplifier stage, which can suppress the power supply noise better, make the high-speed transmission signal have better linearity, and provide a certain gain and bandwidth to ensure the normal transmission of the high-speed signal. The present invention adopts the emitter follower as the output stage, on the one hand, it realizes the common mode level shift of the high-speed signal, and on the other hand, it improves the carrying capacity of the high-speed signal.

In addition, the invention adopts 1.8V power supply to reduce the power consumption of the circuit, with a small process bias in circuit performance.

DETAILED DESCRIPTION OF THE PREFERRED EMBODIMENTS

Embodiments of the present invention will now be described, by way of example only, with reference to the accompanying drawings.

The present invention discloses a low-voltage high-speed programmable equalization circuit, which is mainly applied to high-speed SFP+ and XFP optical transceiver modules. Compared with the traditional circuit structure powered by 3.3V power supply voltage, the equalization circuit of the present invention uses a 1.8V low-voltage external power supply to reduce power consumption. The circuit is designed based on 0.18 μm SiGe BiCMOS technology.

Figure 1:
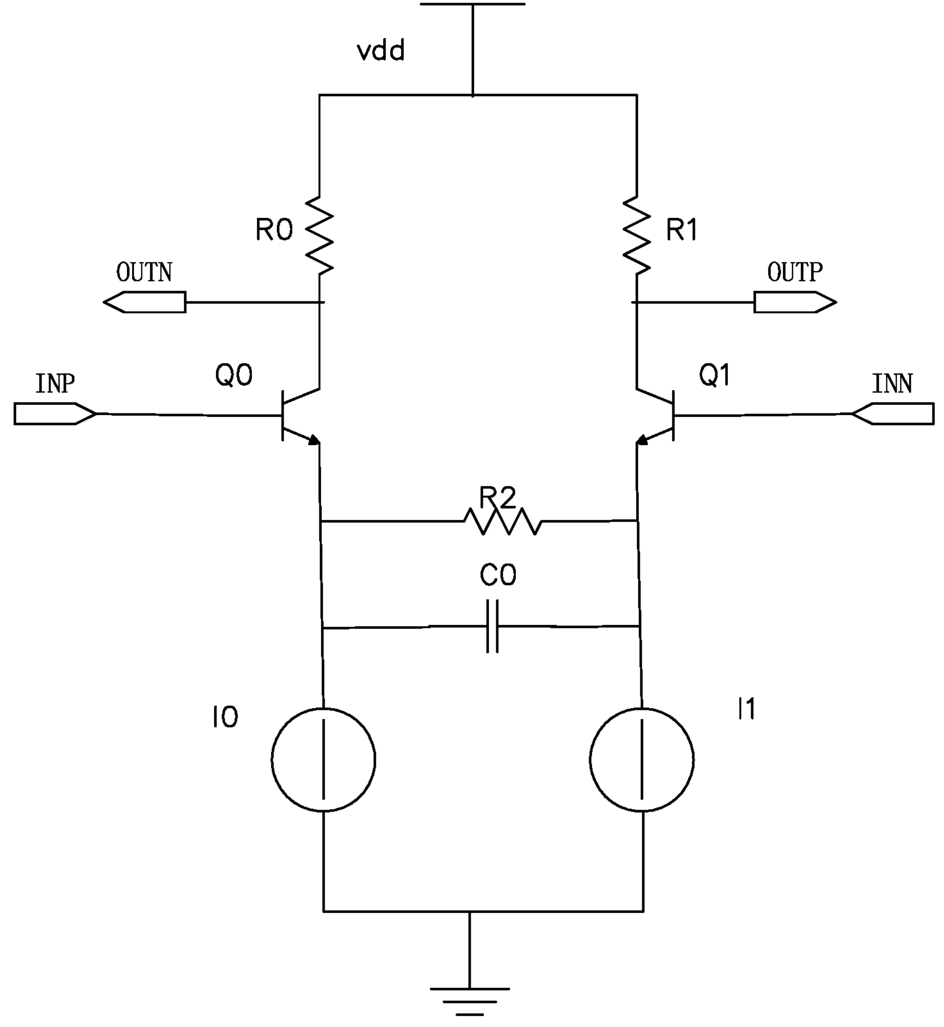
FIG. 1 is a circuit diagram of a conventional equalization circuit.
Figure 2:
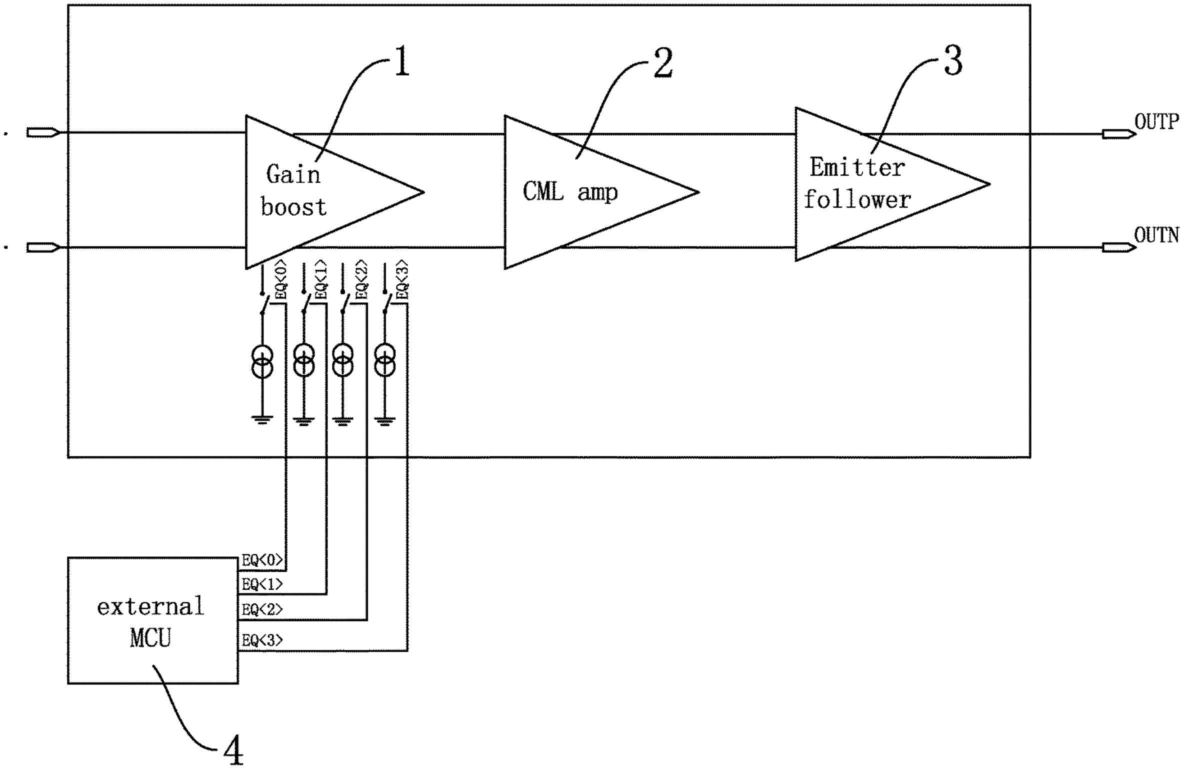
FIG. 2 is a functional block diagram of the equalization circuit of the present invention.

FIG. 2 is a functional block diagram of the equalization circuit of the present invention. In the figure, Gainboost is a gain boosting amplifier stage 1, CML amp is a CML differential amplifier stage 2, and Emitterfollow is an emitter follower 3. As shown in FIG. 2, the low-voltage high-speed programmable equalization circuit of the present invention comprises a gain boosting amplifier stage 1, a CML differential amplifier stage 2, and an emitter follower 3. An input terminal of the gain boosting amplifier stage 1 serves as an input terminal of the equalization circuit. An output terminal of the gain boosting amplifier stage 1 is connected to an input terminal of the CML differential amplifier stage 2. An output terminal of the CML differential amplifier stage 2 is connected to an input terminal of the emitter follower 3. An output terminal of the emitter follower 3 serves as an output terminal of the equalization circuit.

Figure 3:
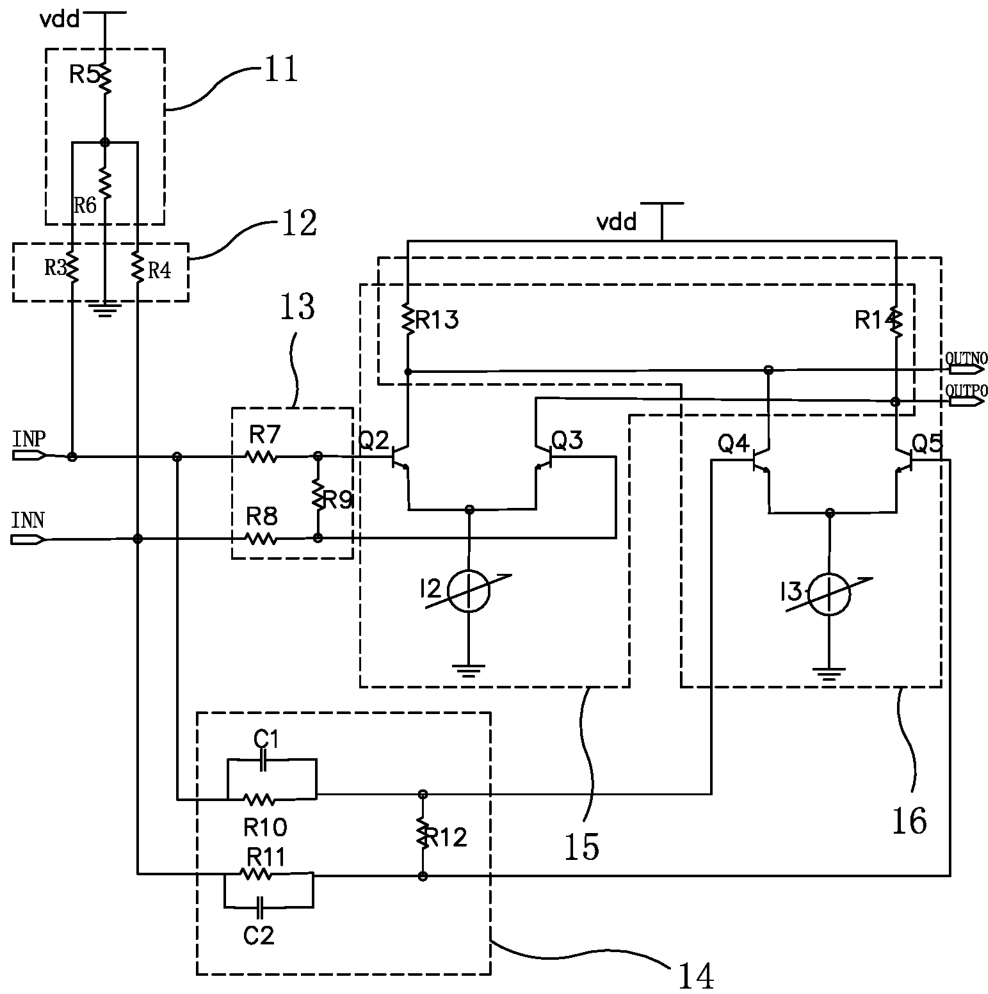
FIG. 3 is a circuit diagram of the gain boosting amplifier stage of the present invention.

Wherein, as shown in FIG. 3, the gain boosting amplifier stage 1 provided for compensating the attenuation of high frequency component of the input signal and amplifying gain includes an input common-mode voltage bias unit 11, an input impedance matching unit 12, a pure resistor network path unit 13, a resistor-capacitor network high-pass path unit 14, a first differential amplifier circuit 15, and a second differential amplifier circuit 16. The input common-mode voltage bias unit 11 is configured to set a bias voltage of the gain boosting amplifier stage 1. The input impedance matching unit 12 is configured to match an input impedance of the gain boosting amplifier stage 1 with an impedance of an input module board connected to a chip. The input terminal of the gain boosting amplifier stage 1 is connected to the pure resistor network path unit 13. The pure resistor network path unit 13 is connected to the first differential amplifier circuit 15. The first differential amplifier circuit 15 is connected to the output terminal of the gain boosting amplifier stage 1. The input terminal of the gain boosting amplifier stage 1 is connected to the resistor-capacitor network high-pass path unit 14. The resistor-capacitor network high-pass path unit 14 is connected to the second differential amplifier circuit 16. The second differential amplifier circuit 16 is connected to the output terminal of the gain boosting amplifier stage 1.

The gain boosting amplifier stage 1 sets bias voltage and matches input impedance by the input common-mode voltage bias unit 11 and input impedance matching unit 12, performs low frequency attenuation and high frequency compensation of the input AC signal by the pure resistor network path unit 13 and resistor-capacitor network high-pass path unit 14, and then processes the attenuated AC signal by the first differential amplifier circuit 15 and second differential amplifier circuit 16, and the resistor-capacitor network high-pass path unit 14 is combined to adjust the ratio of the tail currents I2 and I3 of the first differential amplifier circuit 15 and second differential amplifier circuit 16, and adjust the zero-pole position, so as to achieve the effects of adjusting the high frequency signal gain, realizing the maximum high frequency gain peak programmable design, compensating for the attenuation of high frequency component due to input transmission line loss.

The above-mentioned input common-mode voltage bias unit 11 is provided for setting the bias voltage of the gain boosting amplifier stage 1. The input common-mode voltage bias unit 11 is composed of a resistor R5 and a resistor R6 connected in series with each other, and an end of the resistor R5 is connected to a constant voltage power supply VDD, and an end of the resistor R6 is connected to the input common-mode voltage bias unit 11, and the two resistors R5 and R6 are provided for the voltage division of the power supply vdd to obtain an appropriate common-mode voltage, such that the transistor Q2, transistor Q3, transistor Q4, and transistor Q5 of the first differential amplifier circuit and second differential amplifier circuit are biased to the appropriate common mode voltage to ensure the normal operation of the transistors of the first differential amplifier circuit 15 and second differential amplifier circuit 16.

The input impedance matching unit 12 is provided for matching the input impedance of the gain boosting amplifier stage 1 and connecting the impedance of the input module board of the chip. The input impedance matching unit 12 includes a resistor R3 and a resistor R4, an end of the resistor R3 is connected between the resistor R5 and resistor R6, and another end of the resistor R3 is connected to the input terminal INP of the gain boosting amplifier stage 1; an end of the resistor R4 is connected between the resistor R5 and resistor R6, and another end of the resistor R4 is connected to the input terminal INN of the gain boosting amplifier stage 1. The resistor R3 and resistor R4 are equal to 50Ω respectively to form the input impedance of 100Ω, which is the same as the impedance of the input module board of the chip, so as to provide the best input impedance matching effect. The resistor R3 and resistor R4 of the input impedance matching unit 12 form the input impedance of 100Ω to ensure to have the same impedance with the impedance of the input module board of the chip and provide the best input impedance matching effect. With the good input impedance matching effect, the loss of the input can be minimized.

The pure resistor network path unit 13 is provided for the low frequency attenuation of the input AC signal. The pure resistor network path unit 13 includes a resistor R7, a resistor R8 and a resistor R9. One end of the resistor R7 is connected to the input terminal INP of the gain boosting amplifier stage 1, and another end of the resistor R7 is connected to one end of the resistor R9. One end of the resistor R8 is connected to the input terminal INN of the gain boosting amplifier stage 1, and another end of the resistor R8 is connected to another end of the resistor R9. The first differential amplifier circuit 15 includes a transistor Q2, a transistor Q3, a resistor R13, a resistor R14, and a variable current source I2. A base of the transistor Q2 is connected between the resistor R7 and the resistor R8. An emitter of the transistor Q2 is grounded through the variable current source I2. A collector of the transistor Q2 is connected to the power supply VDD via the resistor R13, and the collector of the transistor Q2 is also connected to the output terminal OUTN0 of the gain boosting amplifier stage 1. A base of the transistor Q3 is connected between the resistor R8 and the resistor R9. An emitter of the transistor Q3 is grounded through the variable current source I2. A collector of the transistor Q3 is connected to the power supply VDD through the resistor R14, and the collector of the transistor Q3 is also connected to the output terminal OUTP0 of the gain boosting amplifier stage 1. The resistor R7, resistor R8, and resistor R9 perform a low frequency attenuation of the input AC signal, and then the attenuated AC signal is added into the transistor Q2 and transistor Q3 of the first differential amplifier circuit for amplification. The AC signal passing through the resistors R7, R8, R9 is attenuated to VIN*R9/(R7+R8+R9), where VIN is the input AC signal.

The resistor-capacitor network high-pass path unit 14 is provided for performing the low frequency attenuation of the input AC signal, and combining the first differential amplifier circuit 15 and second differential amplifier circuit 16 for the high frequency compensation. The resistor-capacitor network high-pass path unit 14 includes a resistor R10, a resistor R11, a resistor R12, a capacitor C1, and a capacitor C2. The resistor R10 and the capacitor C1 are connected in parallel, one end of which is connected to the input terminal INP of the gain boosting amplifier stage 1, and another end of which is connected to one end of the resistor R12. The resistor R11 and the capacitor C2 are connected in parallel, one end of which is connected to the input terminal INN of the gain boosting amplifier stage 1, and another end of which is connected to another end of the resistor R12. The second differential amplifier circuit 16 includes a transistor Q4, a transistor Q5, a resistor R13, a resistor R14, and a variable current source I3. A base of the transistor Q4 is connected to one end, connected to the resistor R10 and the capacitor C1, of the resistor R12. An emitter of the transistor Q4 is grounded through the variable current source I3. A collector of the transistor Q4 is connected to the power supply VDD via the resistor R13, and the collector of the transistor Q4 is also connected to the output terminal OUTN0 of the gain boosting amplifier stage 1. A base of the transistor Q5 is connected to another end, connected to the resistor R11 and the capacitor C2, of the resistor R12. An emitter of the transistor Q5 is grounded through the variable current source I3. A collector of the transistor Q5 is connected to the power supply VDD via the resistor R14, and the collector of the transistor Q5 is also connected to the output terminal OUTP0 of the gain boosting amplifier stage 1. The resistor R10, resistor R11, and resistor R12 perform a low frequency attenuation of the input AC signal, and the AC signal passing through the resistor R10, resistor R11, and resistor R12 is attenuated to VIN*R12/(R10+R11+R12). R12/(R10+R11+R12)=R9/(R7+R8+R9), ensures that the low frequency AC signals added to the transistor Q2 and transistor Q3, and the transistor Q4 and transistor Q5 are equal. The attenuated low frequency signal is inputted to the transistor Q4 and transistor Q5; the resistor R10 and capacitor C1 are connected in parallel to each other, and the resistor R11 and capacitor C2 are connected in parallel to each other, so as to realize the high frequency compensation of the input AC signal. After the high frequency compensation, the signals are added to the transistor Q4 and transistor Q5 of the second differential amplifier circuit 16 for amplification.

In the above-mentioned gain boosting amplifier stage 1, the total current of the variable current source I2 of the first differential amplifier circuit 15 and the variable current source I3 of the second differential amplifier circuit 16 remains constant. As shown in FIG. 2, the variable current source I2 and the variable current source I3 may be set in terms of current using an external MCU (microprocessor) 4. When the application scenario changes, an external MCU 4 may be used to control and adjust the ratio of the tail current of the two differential amplifier circuits provided that the total current of I2 and I3 remains unchanged. For example, I2+I3=a, when I2=0.1a, I3=0.9a, different ratios of I2 and I3 can realize equalization compensation factors. By adjusting the ratio of the tail current of the two differential amplifier circuits, it is possible to achieve different equalization compensation factors, adjust the pole-zero position, thereby adjusting the high-frequency gain and achieving high-pass filtering. Then, it is further processed by differential amplifier circuits with different weights, so as to increase the gain of high-frequency signals.

Figure 4:
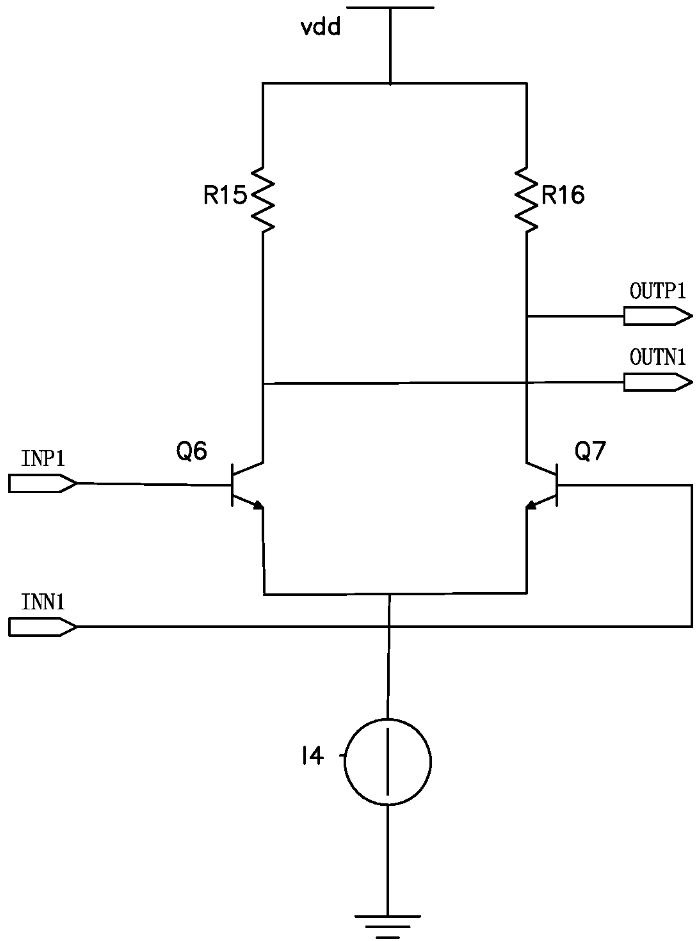
FIG. 4 is a circuit diagram of the CML differential amplifier stage of the present invention.

As shown in FIG. 4, the CML differential amplifier stage 2 includes a transistor Q6, a transistor Q7, a resistor R15, a resistor R16, and a current source I4. A base of the transistor Q6 is connected to the input terminal INP1 of the CML differential amplifier stage 2. The input terminal INP1 of the CML differential amplifier stage 2 is connected to the output terminal OUTP0 of the gain boosting amplifier stage 1. An emitter of the transistor Q6 is grounded via the current source I4. A collector of the transistor Q6 is connected to the power supply VDD via the resistor R15, and the collector of the transistor Q6 is also connected to the output terminal OUTN1 of the CML differential amplifier stage 2. A base of the transistor Q7 is connected to the input terminal INN1 of the CML differential amplifier stage 2. The input terminal INN1 of the CML differential amplifier stage 2 is connected to the output terminal OUTP0 of the gain boosting amplifier stage 1. An emitter of the transistor Q7 is grounded via the current source I4. A collector of the transistor Q7 is connected to the power supply VDD via the resistor R16, and the collector of the transistor Q7 is also connected to the output terminal OUTP1 of the CML differential amplifier stage 2.

The CML differential amplifier stage 2 combines two identical single-ended signal paths to process two differential phase signals, respectively. Compared with the single-ended signal amplification stage, it has some following advantages, higher capability to suppress power supply noise, larger output voltage swing, and higher linearity. Therefore, the CML differential amplifier stage 2 can suppress power supply noise better, make the high-speed transmission signal have better linearity, and provide a certain gain and bandwidth to ensure the normal transmission of high-speed signals.

Figure 5:
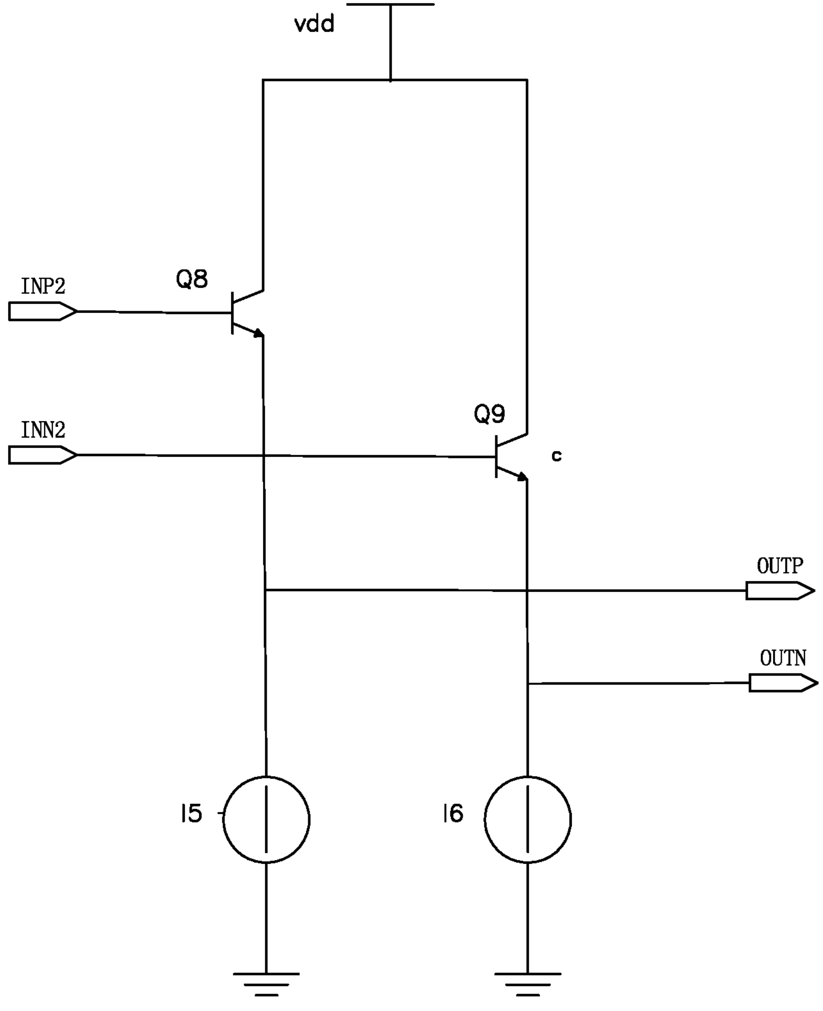
FIG. 5 is a circuit diagram of the emitter follower of the present invention.

As shown in FIG. 5, the emitter follower 3 includes a transistor Q8, a transistor Q9, a current source I5, and a current source I6. A base of the transistor Q8 is connected to the input terminal INP2 of the emitter follower 3. The input terminal INP2 of the emitter follower 3 is connected to the output terminal OUTP1 of the CML differential amplifier stage 2. A collector of the transistor Q8 is connected to the power supply VDD. An emitter of the transistor Q8 is grounded via the current source I5, and the emitter of the transistor Q8 is also connected to the output OUTP of the emitter follower 3. A base of the transistor Q9 is connected to the input terminal INN2 of the emitter follower 3. The input terminal INN2 of the emitter follower 3 is connected to the output terminal OUTN1 of the CML differential amplifier stage 2. A collector of the transistor Q9 is connected to the power supply VDD. An emitter of the transistor Q9 is grounded via the current source I6, and the emitter of the transistor Q9 is also connected to the output OUTN of the emitter follower 3.

The emitter follower 3 has high input impedance, low output impedance, and a voltage gain of approximately 1, in order to reduce the load of the preceding-stage signal source as the input impedance of the subsequent stage. Because the DC output voltage follows the DC input voltage $V_{BE}$, it is used in a unity gain level shift circuit.

The present invention combines the gain boosting amplifier stage 1, the CML differential amplifier stage 2, and the emitter follower 3. First, through the gain boosting amplifier stage 1 of the present invention, the input signal passes through one path, the pure resistor network all-pass path, and another path, the resistor-capacitor network high-pass path, thereby achieving high-pass filtering and minimizing effective high-speed signal loss. The two variable current sources of the gain boosting amplifier stage 1 can realize the programmable equalization compensation to meet the requirements of various applications. Therefore, according to different cable lengths in different application scenarios, suitable equalization compensation can be achieved. Moreover, adjusting the ratio of the two variable current sources will not affect the carrying capacity of high-speed signals.

In addition, the present invention adopts the emitter follower 3 as the output stage, on the one hand, it realizes the common mode level shift of the high-speed signal, and on the other hand, it improves the carrying capacity of the high-speed signal. The invention adopts 1.8V power supply to reduce the power consumption of the circuit, with a small process bias in circuit performance.

Although particular embodiments of the present invention have been described in detail for purposes of illustration, various modifications and enhancements may be made without departing from the spirit and scope of the present invention. Accordingly, the present invention is not to be limited except as by the appended claims.

What is claimed is:

1. An equalization circuit, comprising a gain boosting amplifier stage, a CML differential amplifier stage, and an emitter follower; an input terminal of the gain boosting amplifier stage serving as an input terminal of the equalization circuit, an output terminal of the gain boosting amplifier stage being connected to an input terminal of the CML differential amplifier stage; an output terminal of the CML differential amplifier stage being connected to an input terminal of the emitter follower, an output terminal of the emitter follower serving as an output terminal of the equalization circuit;

the gain boosting amplifier stage including an input common-mode voltage bias unit, an input impedance matching unit, a pure resistor network path unit, a resistor-capacitor network high-pass path unit, a first differential amplifier circuit, and a second differential amplifier circuit; the input common-mode voltage bias unit being configured to set a bias voltage of the gain boosting amplifier stage, the input impedance matching unit being configured to match an input impedance of the gain boosting amplifier stage with an impedance of an input module board connected to a chip; the input terminal of the gain boosting amplifier stage being connected to the pure resistor network path unit, the pure resistor network path unit being connected to the first differential amplifier circuit, the first differential amplifier circuit being connected to the output terminal of the gain boosting amplifier stage; the input terminal of the gain boosting amplifier stage being connected to the resistor-capacitor network high-pass path unit, the resistor-capacitor network high-pass path unit being connected to the second differential amplifier circuit, the second differential amplifier circuit being connected to the output terminal of the gain boosting amplifier stage;

each of the first differential amplifier circuit and the second differential amplifier circuit being provided with a variable current source, a total current of the two variable current sources being kept constant.

2. The equalization circuit as claimed in claim 1, wherein the input common-mode voltage bias unit includes a resistor R5 and a resistor R6, the resistor R5 and the resistor R6 are connected in series, one end of the resistor R5 is connected to a constant voltage power supply VDD, one end of the resistor R6 is grounded;

the input impedance matching unit includes a resistor R3 and a resistor R4, one end of the resistor R3 is connected between the resistor R5 and the resistor R6, another end of the resistor R3 is connected to the input terminal INP of the gain boosting amplifier stage; one end of the resistor R4 is connected between the resistor R5 and the resistor R6, another end of the resistor R4 is connected to the input terminal INN of the gain boosting amplifier stage;

the pure resistor network path unit includes a resistor R7, a resistor R8 and a resistor R9, one end of the resistor R7 is connected to the input terminal INP of the gain boosting amplifier stage, another end of the resistor R7 is connected to one end of the resistor R9; one end of the resistor R8 is connected to the input terminal INN of the gain boosting amplifier stage, another end of the resistor R8 is connected to another end of the resistor R9;

the first differential amplifier circuit includes a transistor Q2, a transistor Q3, a resistor R13, a resistor R14, and a variable current source I2; a base of the transistor Q2 is connected between the resistor R7 and the resistor R8, an emitter of the transistor Q2 is grounded through the variable current source I2, a collector of the transistor Q2 is connected to the power supply VDD via the resistor R13 and the collector of the transistor Q2 is further connected to the output terminal OUTN0 of the gain boosting amplifier stage; a base of the transistor Q3 is connected between the resistor R8 and the resistor R9, an emitter of the transistor Q3 is grounded through the variable current source I2, a collector of the transistor Q3 is connected to the power supply VDD through the resistor R14, and the collector of the transistor Q3 is further connected to the output terminal OUTP0 of the gain boosting amplifier stage;

the resistor-capacitor network high-pass path unit includes a resistor R10, a resistor R11, a resistor R12, a capacitor C1, and a capacitor C2; the resistor R10 and the capacitor C1 are connected in parallel, one end of which is connected to the input terminal INP of the gain boosting amplifier stage, and another end of which is connected to one end of the resistor R12; the resistor R11 and the capacitor C2 are connected in parallel, one end of which is connected to the input terminal INN of the gain boosting amplifier stage, and another end of which is connected to another end of the resistor R12;

the second differential amplifier circuit includes a transistor Q4, a transistor Q5, a resistor R13, a resistor R14, and a variable current source I3; a base of the transistor Q4 is connected to the end, connected to the resistor R10 and the capacitor C1, of the resistor R12, an emitter of the transistor Q4 is grounded through the variable current source I3, a collector of the transistor Q4 is connected to the power supply VDD via the resistor R13, and the collector of the transistor Q4 is further connected to the output terminal OUTN0 of the gain boosting amplifier stage; a base of the transistor Q5 is connected to the end, connected to the resistor R11 and the capacitor C2, of the resistor R12, an emitter of the transistor Q5 is grounded through the variable current source I3, a collector of the transistor Q5 is connected to the power supply VDD via the resistor R14, and the collector of the transistor Q5 is further connected to the output terminal OUTP0 of the gain boosting amplifier stage.

3. The equalization circuit as claimed in claim 2, wherein the CML differential amplifier stage includes a transistor Q6, a transistor Q7, a resistor R15, a resistor R16, and a current source I4; a base of the transistor Q6 is connected to the input terminal INP1 of the CML differential amplifier stage, the input terminal INP1 of the CML differential amplifier stage is connected to the output terminal OUTP0 of the gain boosting amplifier stage; an emitter of the transistor Q6 is grounded via the current source I4, a collector of the transistor Q6 is connected to the power supply VDD via the resistor R15, and the collector of the transistor Q6 is further connected to the output terminal OUTN1 of the CML differential amplifier stage;

a base of the transistor Q7 is connected to the input terminal INN1 of the CML differential amplifier stage, the input terminal INN1 of the CML differential amplifier stage is connected to the output terminal OUTP0 of the gain boosting amplifier stage, an emitter of the transistor Q7 is grounded via the current source I4, a collector of the transistor Q7 is connected to the power supply VDD via the resistor R16, and the collector of the transistor Q7 is further connected to the output terminal OUTP1 of the CML differential amplifier stage.

4. The equalization circuit as claimed in claim 3, wherein the emitter follower includes a transistor Q8, a transistor Q9, a current source I5, and a current source I6; a base of the transistor Q8 is connected to the input terminal INP2 of the emitter follower, the input terminal INP2 of the emitter follower is connected to the output terminal OUTP1 of the CML differential amplifier stage; a collector of the transistor Q8 is connected to the power supply VDD, an emitter of the transistor Q8 is grounded via the current source I5, and the emitter of the transistor Q8 is further connected to the output OUTP of the emitter follower; a base of the transistor Q9 is connected to the input terminal INN2 of the emitter follower, the input terminal INN2 of the emitter follower is connected to the output terminal OUTN1 of the CML differential amplifier stage; a collector of the transistor Q9 is connected to the power supply VDD, an emitter of the transistor Q9 is grounded via the current source I6, and the emitter of the transistor Q9 is further connected to the output OUTN of the emitter follower.

* * * * *